(12) United States Patent
Morita (10) Patent No.: US 6,464,512 B2
(45) Date of Patent: Oct. 15, 2002

(54) APPARATUS WITH SPRING-LOADED CONTACTS

(75) Inventor: Hideyo Morita, Mihara-gun (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/951,626

(22) Filed: Sep. 14, 2001

(65) Prior Publication Data

US 2002/0034895 A1 Mar. 21, 2002

(30) Foreign Application Priority Data

Sep. 18, 2000 (JP) ........................................ 2000-282751

(51) Int. Cl.$^7$ ............................................... H01R 12/00
(52) U.S. Cl. ........................................ 439/66; 439/862
(58) Field of Search .................................... 439/862, 66

(56) References Cited

U.S. PATENT DOCUMENTS 5,655,913 A * 8/1997 Castaneda et al. ............ 439/66

FOREIGN PATENT DOCUMENTS

JP 7-19949 4/1995

* cited by examiner

Primary Examiner—Gary Paumen
Assistant Examiner—Ann M McCamey
(74) Attorney, Agent, or Firm—Wenderoth, Lind & Ponack, L.L.P.

(57) ABSTRACT

An apparatus having spring-loaded contacts for electrically connecting with electrical equipment terminals. First spring-loaded contacts and second spring-loaded contacts are disposed in close proximity. Each of the first and second spring-loaded contacts has a pair of connection segments for connecting with each electrical equipment terminal, attachment segments which attach to a board or substrate, and flexible arm segments between the attachment segments and connection segments. The flexible arm segments are adapted to press the connection segments resiliently against the electrical equipment terminals. Each pair of flexible arm segments of a first spring-loaded contact defines a widened region where the flexible arm segments extend towards the connection segments of a second spring-loaded contact, and part of the second spring-loaded contact is disposed inside the widened region of the first spring-loaded contact.

17 Claims, 12 Drawing Sheets

APPARATUS WITH SPRING-LOADED CONTACTS

This application is based on an application No. 282751 filed in Japan on Sep. 18, 2000, the content of which is incorporated herein by reference.

BACKGROUND OF THE INVENTION

This invention relates to an apparatus provided with spring-loaded contacts that can reliably make electrical connection with terminals of electrical equipment attached in a detachable fashion.

There are various combinations of apparatus with electrical equipment attached in a detachable fashion. For example, a DVD player may be attached to in a detachable fashion to a power supply housing batteries to supply power to the DVD player. Here, the power supply is the apparatus and the DVD player is the electrical equipment. Apparatus and electrical equipment, which attach in a detachable fashion, make electrical connection via spring-loaded contacts as described, for example, in Japanese Patent Application HEI-7-19949 (1995). Spring-loaded contacts are provided with flexible arm segments and these flexible arm segments resiliently press connection segments against electrical equipment terminals to prevent contact failure. However, even with this configuration, contact failure problems cannot be solved in an ideal fashion. In particular, the probability of contact failure increases as time of use increases.

The probability of contact failure can be significantly reduced by making contact to a single terminal with a plurality of spring-loaded contacts For example, if the probability of one contact failing after a given time of use is $1/100$, the probability of contact failure for two redundant contacts is significantly reduced at $1/100 \times 1/100 = 1/10000$. Further, in the case where a contact supplies high current, a plurality of contacts can divide up that current for supply. This has the characteristic that effective contact resistance and the voltage drop across the contacts can be reduced.

Figure 1:
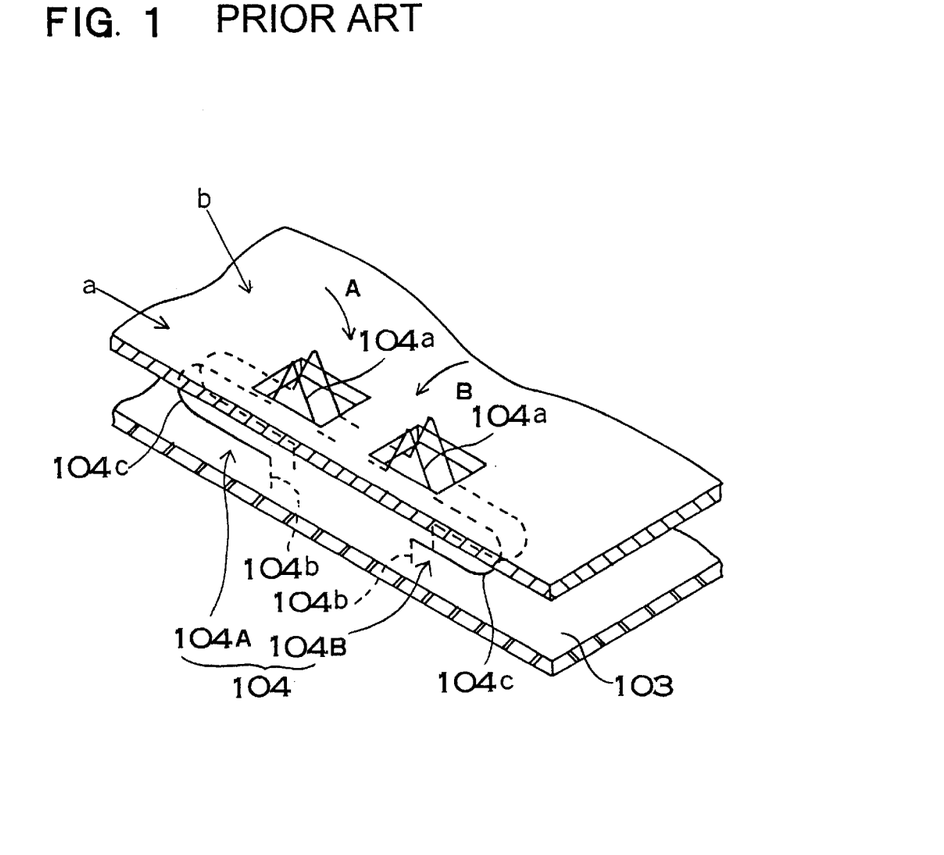
FIG. 1 is a perspective view partially in cross-section showing the contact structure of a related art apparatus provided with a plurality of spring-loaded contacts.

FIG. 1 shows a plurality of spring-loaded contacts 104 connected to terminals. The spring-loaded contacts 104 of this figure are provided with a first spring-loaded contact 104A and a second spring-loaded contact 104B to connect with two terminals of the electrical equipment. The first and second spring-loaded contacts 104A, 104B are provided with connection segments 104a to connect with terminals, attachment segments 104b to attach to the board or substrate, and flexible arm segments 104c between the attachment segments 104b and the connection segments 104a. The spring-loaded contacts 104 of FIG. 1 are oriented in opposition with connection segments 104a of the first and second spring-loaded contacts 104A, 104B in close proximity. Specifically, the flexible arm segments 104c of the first and second spring-loaded contacts 104A, 104B are disposed on both sides of the connection segments 104a.

When the connection segments 104a of the first and second spring-loaded contacts 104A, 104B are pushed down by electrical equipment terminals, they move in the directions indicated by the arrows A and B of FIG. 1. Specifically, the connection segments 104a of the first and second spring-loaded contacts 104A, 104B incline and move towards each other as they are pushed down. Both connection segments 104a do not move in parallel in the same direction as they are pushed down. Connection segments which do not move in the same direction will have excessive force applied to one side or the other when electrical equipment is attached, and both connection segments cannot connect to terminals in an ideal fashion. For example, when electrical equipment is attached in the direction indicated by the arrows a or b of FIG. 1, the first spring-loaded contact 104A bends smoothly, but the second spring-loaded contact 104B cannot bend smoothly. This is because the second spring-loaded contact 104B bends in the direction indicated by arrow B, but does not move in the direction of electrical equipment attachment. Therefore, this system has the drawback that the second spring-loaded contact 104B can be damaged and contact failure can occur easily.

Figure 2:
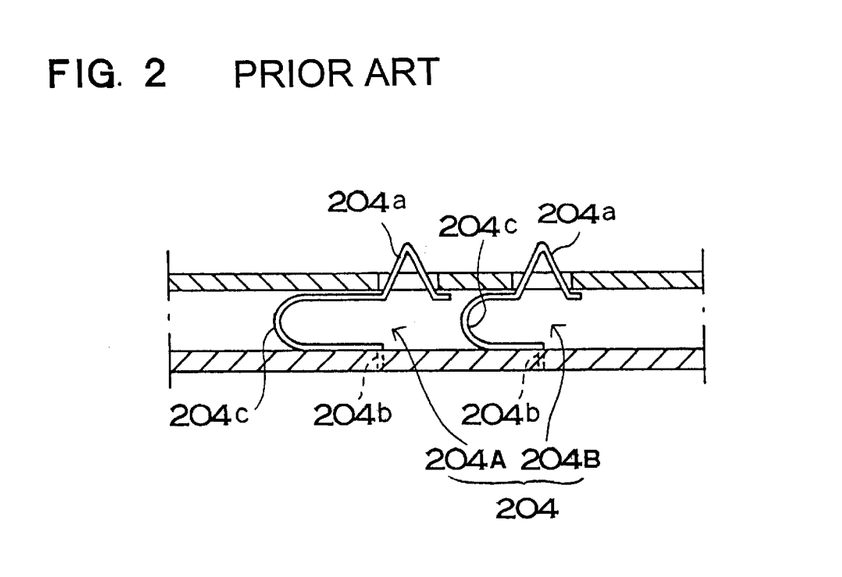
FIG. 2 is a cross-sectional view of another configuration for connection of a plurality of spring-loaded contacts to terminals.

This problem can be solved by orienting the first and second spring-loaded contacts in the same direction. For example, as shown in FIG. 2, the connection segments 204a of the first spring-loaded contact 204A and the second spring-loaded contact 204B can be disposed in the same manner at the right ends of the spring-loaded contacts. However, spring-loaded contacts 204 arranged in this fashion result in shorter flexible arm segments 204c for the second spring-loaded contact 204B and thus a shorter bending stroke. This problem can be solved by widening the distance between the connection segments 204a of the first and second spring-loaded contacts 204A, 204B. However, since the distance between the connection segments of the first and second spring-loaded contacts is determined by the distance between electrical equipment terminals, that distance cannot be widened indefinitely. This is because the terminals of almost all electrical equipment are disposed in close proximity to one another. Therefore, two connection segments which connect to closely spaced terminals must be disposed close to one another. Consequently, spring-loaded contacts configured as shown in FIG. 2 have the drawback that the spring-loaded contact with the short bending stroke cannot press smoothly against a terminal for electrical connection and can be easily damaged.

The present invention was developed to solve these problems. Thus it is a primary object of the present invention to provide an apparatus with spring-loaded contacts which can make stable connection to closely spaced terminals and radically reduce contact failure over long time periods. The above and further objects and features of the invention will more fully be apparent from the following detailed description with accompanying drawings.

SUMMARY OF THE INVENTION

The apparatus with spring-loaded contacts of the present invention is provided with spring-loaded contacts to resiliently press against, and make electrical connection to terminals of electrical equipment attached in a detachable fashion. These spring-loaded contacts are provided with a first spring-loaded contact and a second spring-loaded contact disposed close to one another. The first and second spring-loaded contacts are provided with connection segments which connect with electrical equipment terminals, attachment segments which attach to the board or substrate, and flexible arm segments between the attachment segments and the connection segments. The flexible arm segments can bend to resiliently press the connection segments against electrical equipment terminals. The first spring-loaded contact and the second spring-loaded contact are each provided with a pair of connection segments disposed in close proximity. The pair of flexible arm segments connected to the pair of connection segments on the first spring-loaded contact has a widened region where the flexible arm segments extend towards the connection segments of the second spring-loaded contact. Part of the second spring-loaded contact is disposed within the widened region of the first spring-loaded contact.

The first and second spring-loaded contacts can be made the same shape. Further, the flexible arm segments of the first and second spring-loaded contacts can be oriented to extend in the same direction.

A spring-loaded contact with two connection segments can be formed from a single strand of flexible wire material or from two strands of flexible wire material. The spring-loaded contacts can be mounted in holders to retain them in fixed positions.

An apparatus with spring-loaded contacts configured as described above is characterized by the capability to make stable connection to closely spaced terminals and to radically reduce contact failure over long time periods. This is because the first and second spring-loaded contacts, which are provided with connection segments that connect with terminals, attachment segments that attach to the board or substrate, and flexible arm segments that bend, are disposed close to one another. This is also because the first and second spring-loaded contacts are each provided with a closely spaced pair of connection segments, and the pair of flexible arm segments connected to the pair of connection segments on the first spring-loaded contact has a widened region where the flexible arm segments extend towards the connection segments of the second spring-loaded contact. This configuration of apparatus with spring-loaded contacts has one part of the second spring-loaded contact disposed within the widened region of the first spring-loaded contact. Namely, the first and second spring-loaded contacts can be disposed with one part of the spring-loaded contacts overlapping. Consequently, the first and second spring-loaded contacts can be disposed close to one another and can make stable connection to closely spaced terminals. Further, by disposing the first and second spring-loaded contacts with the same orientation, the second spring-loaded contact can bend smoothly with an optimal stroke. Therefore, spring-loaded contacts can press against, and make electrical connection to terminals without application of excessive force, and spring-loaded contact damage can be prevented to radically reduce contact failure.

DETAILED DESCRIPTION OF THE INVENTION

In the present application, electrical equipment which connects via spring-loaded contacts is, for example, a DVD player, video game equipment, battery pack, or electrical equipment housing batteries. For the case where the electrical equipment is a DVD player or video game equipment, the apparatus which connects with those devices is, for example, a power supply housing batteries or a power supply housing a circuit to deliver power to the electrical equipment. For the case where the electrical equipment is a battery pack or electrical equipment housing batteries, the apparatus which connects with those devices is, for example, a battery charger. However, the present invention does not specify or restrict the type of apparatus or electrical equipment which attaches to the apparatus.

Figure 3:
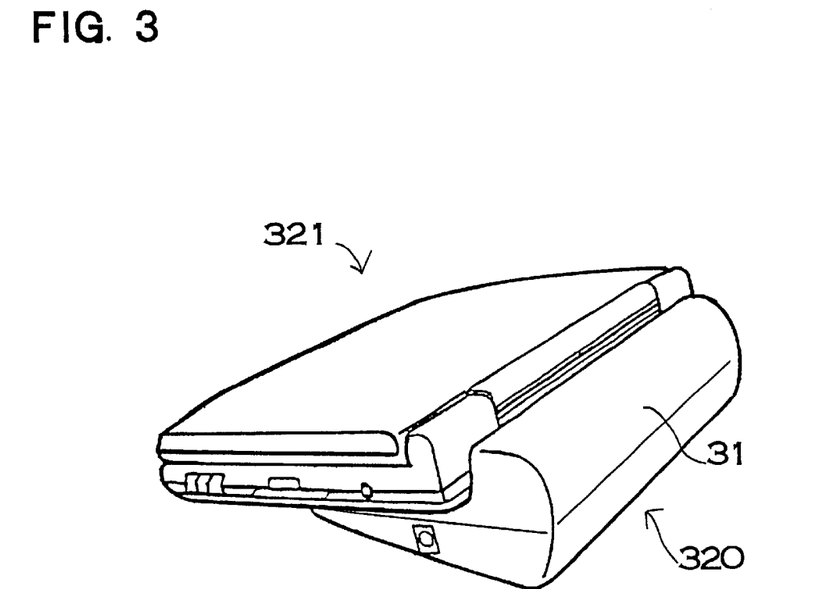
FIG. 3 is a perspective view showing electrical equipment attached to an apparatus of an embodiment of the present invention.

The following describes, as a specific example, a DVD player as electrical equipment and a power supply housing rechargeable batteries as an apparatus to supply power to the DVD player which attaches in a detachable fashion. Turning to FIG. 3, a DVD player, which is the electrical equipment 321, is attached in a detachable manner to a power supply, which is the apparatus 320. The electrical equipment 321 is attached in a detachable manner to the inclined surface of the apparatus 320, and a metal plate such as an aluminum plate is fixed to its bottom surface as a heat dissipating plate. Further, the width of the electrical equipment 321 is greater than the width of the apparatus 320, and the electrical equipment 321 attaches to the apparatus 320 with both sides jutting out beyond the sides of the apparatus 320. This configuration has the characteristic that the electrical equipment 321 and the apparatus 320 can effectively dissipate heat. This is because the heat dissipating plate provided on the bottom of the electrical equipment 321 is inclined and air can easily flow along this bottom surface. It is also because both sides of the electrical equipment 321 jut out beyond the sides of the apparatus 320 allowing effective heat dissipation in those regions. How effectively heat can be dissipated to reduce internal temperatures is extremely important for electrical equipment, such as a DVD player, which consumes considerable power. If internal temperatures rise abnormally, electronic components fail to operate normally inviting malfunctions and shortening operating lifetime. An apparatus which has high power consumption electrical equipment attached to it has high power output and also generates considerable heat. For example, when high currents are supplied to the electrical equipment from a power supply housing rechargeable batteries, which is the apparatus, heat generation by the rechargeable batteries increases and the temperature of the apparatus rises. The configuration of FIG. 3 gives good heat dissipating efficiency and allows lower internal temperatures. This is because the electrical equipment 321 attachment surface is an inclined surface. In particular, provision of even slight gaps in the apparatus 320 casing can cause air to smoothly flow for effective cooling. To accomplish this, upper and lower cases 31 can be connected in a construction which provides gaps in the casing.

Figure 4:
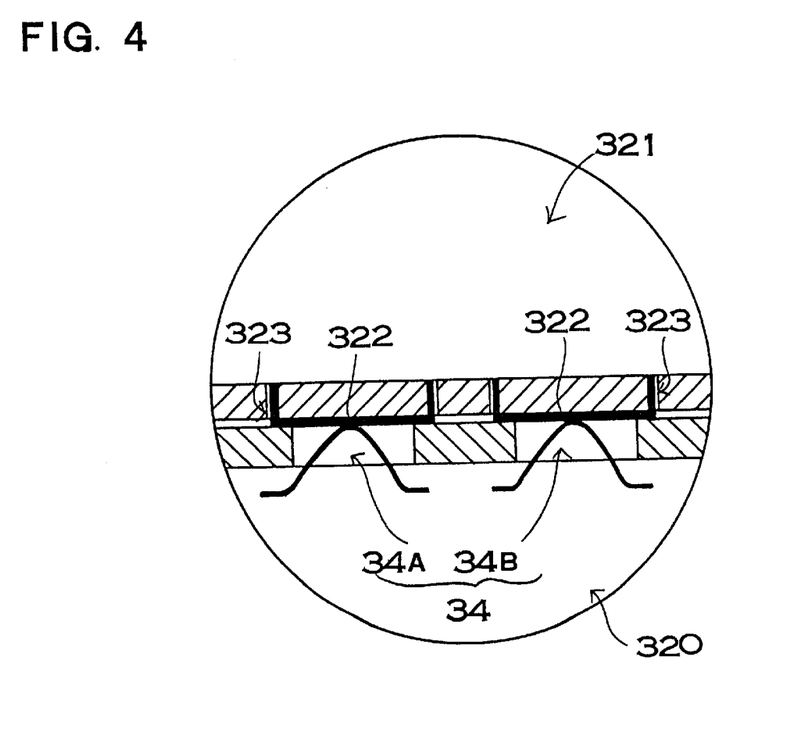
FIG. 4 is an enlarged cross-sectional view showing connection of spring-loaded contacts of the apparatus shown in FIG. 3 with electrical equipment terminals.
Figure 5:
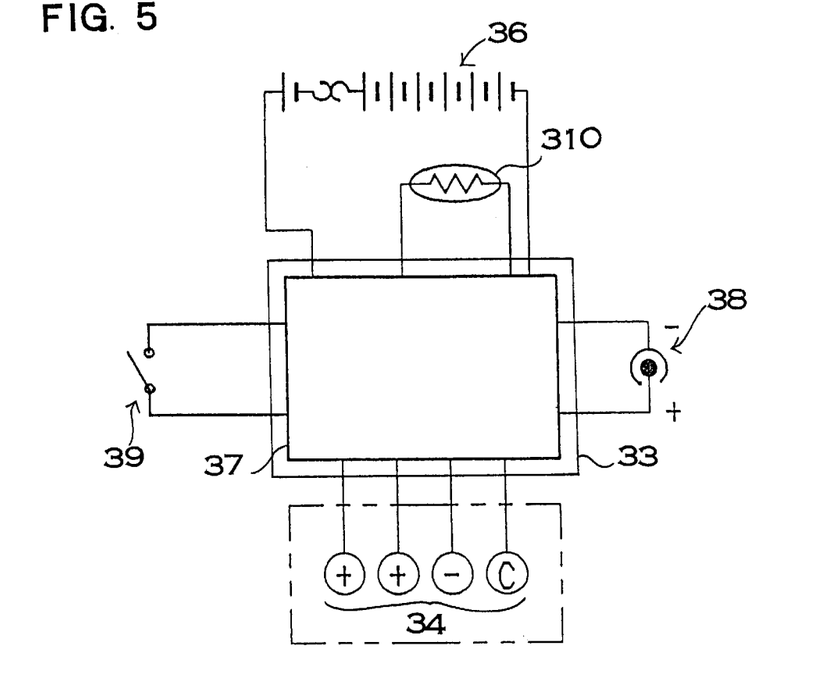
FIG. 5 is a circuit diagram of an apparatus of an embodiment of the present invention.

The electrical equipment 321 is provided with four terminals exposed on its bottom surface to receive power supplied from the apparatus 320. As shown in FIG. 4, electrode windows 323 are opened through the bottom surface of the electrical equipment 321 and terminals 322 are disposed within those electrode windows 323. FIG. 5 is a circuit diagram of the apparatus 320 to which the four terminals 322 of the electrical equipment 321 connect. This apparatus 320 is provided with four sets of spring-loaded contacts 34 which connect with the four terminals 322. These and other spring-loaded contacts 34 make up two positive contacts, one negative contact, and one signal contact.

The apparatus shown in this circuit diagram is provided with rechargeable batteries 36, a circuit board 33 which holds a surface mounted control circuit 37 connected to the rechargeable batteries 36 to control their charge and discharge, charging terminals 38 on the circuit board 33 which supply power to charge the rechargeable batteries 36, a switch 39 to detect attachment of electrical equipment 321 to the apparatus, and a temperature sensing device 310 which is a thermistor to detect rechargeable battery 36 temperature. The four spring-loaded contacts 34 are connected to the circuit board 33. The circuit board 33 detects attachment of the electrical equipment with the switch 39 and connects the rechargeable batteries 36 to the spring-loaded contacts 34 to supply power to the electrical equipment via the spring-loaded contacts 34.

The rechargeable batteries 36 are batteries such as nickel-cadmium batteries, nickel-hydrogen batteries, or lithium-ion rechargeable batteries. The rechargeable batteries 36 are charged by connecting a charging power supply to the charging terminals 38. When the rechargeable batteries 36 reach full charge, the control circuit 37 mounted on the circuit board 33 suspends battery charging. In addition, the control circuit 37 detects rechargeable battery 36 temperature with the temperature sensing device 310 and suspends charging or discharging when battery temperature rises abnormally high. Further, the control circuit 37 detects electrical equipment attachment with the switch 39 and connects the rechargeable batteries 36 to the spring-loaded contacts 34. When electrical equipment is not attached, the rechargeable batteries 36 are not connected to the spring-loaded contacts 34. For this reason, even if a metallic object touches the spring-loaded contacts 34 projecting from the case 31, short circuit will not occur.

Figure 6:
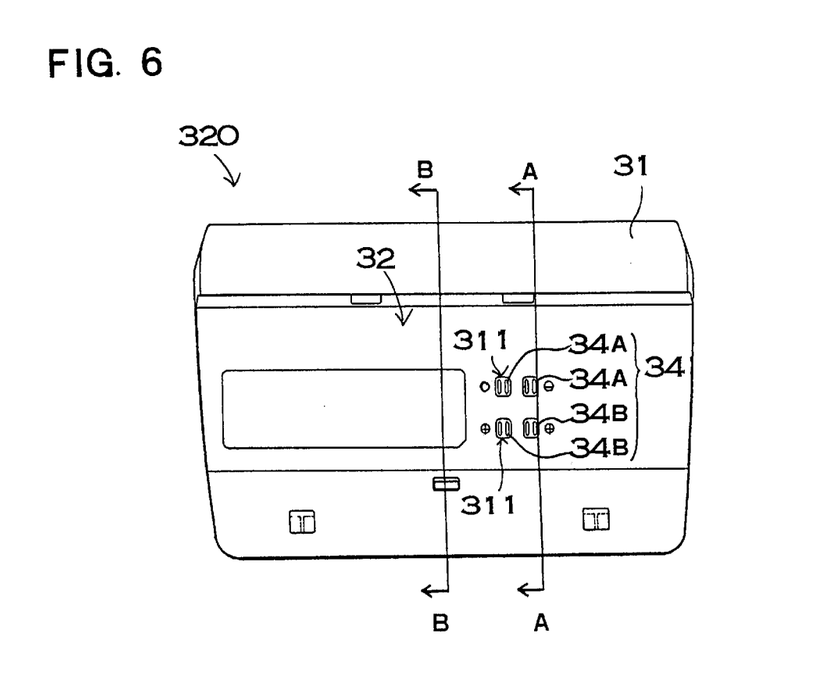
FIG. 6 is a plan view of an apparatus of an embodiment of the present invention.
Figure 7:
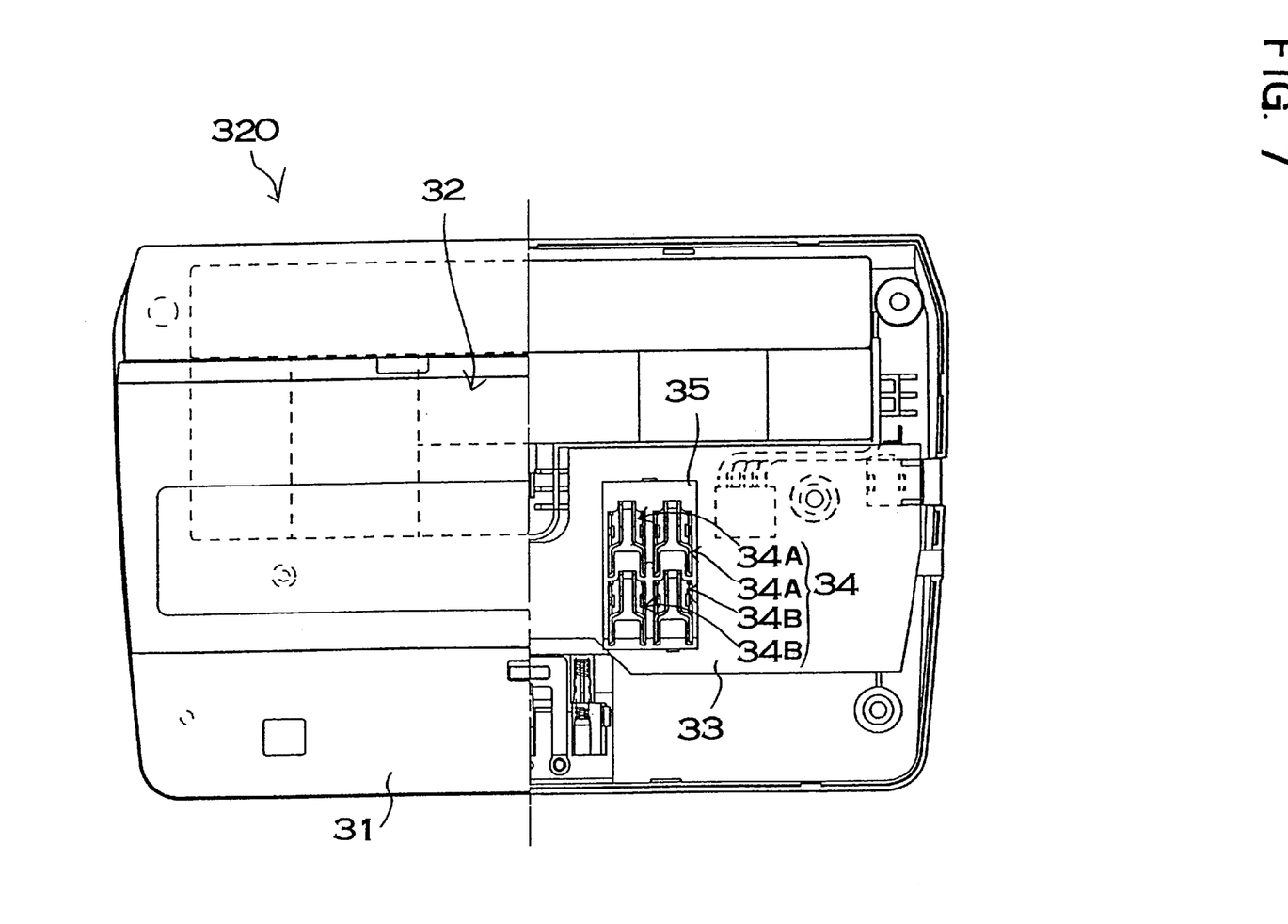
FIG. 7 is a plan view of the apparatus shown in FIG. 6 with one section removed.
Figure 8:
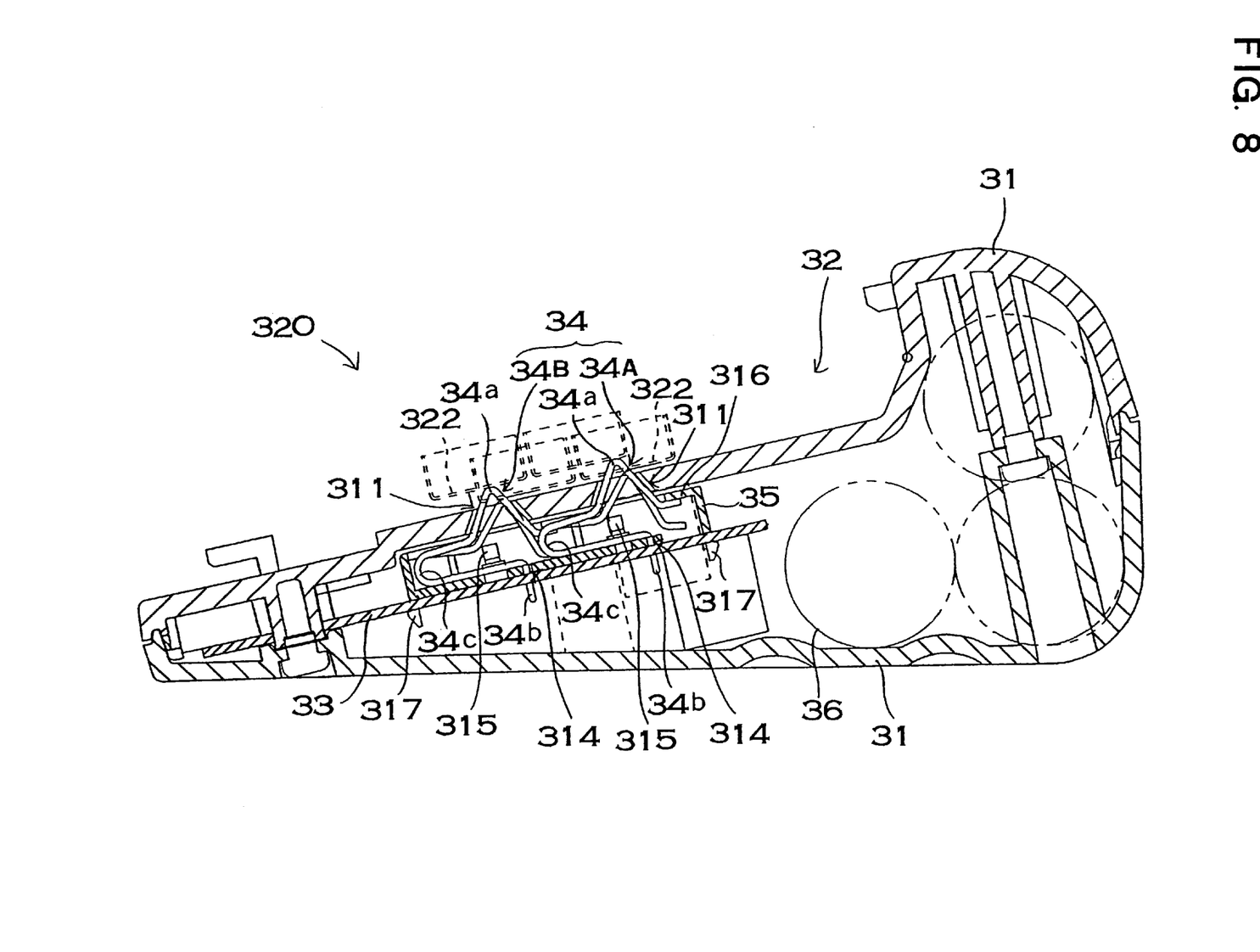
FIG. 8 is a cross-sectional view taken along line A—A on the apparatus shown in FIG. 6.
Figure 9:
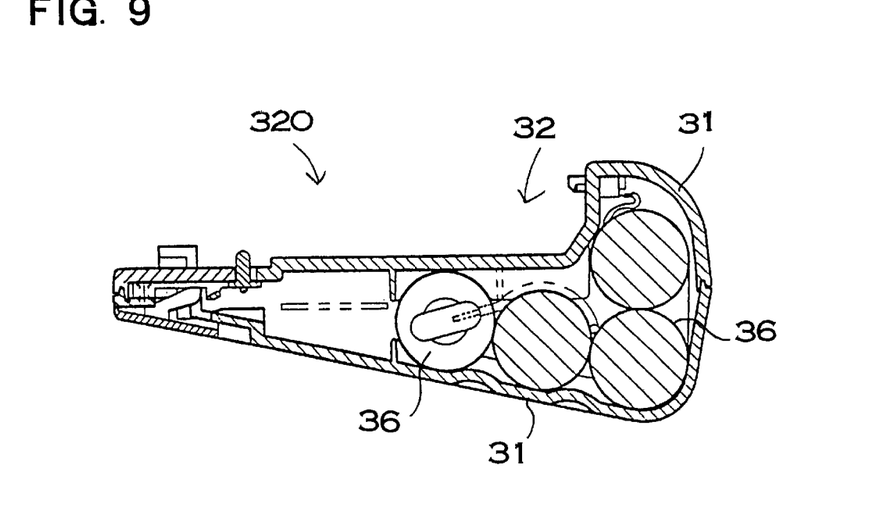
FIG. 9 is a cross-sectional view taken along line B—B on the apparatus shown in FIG. 6.

FIGS. 6 through 9 a plan view of the apparatus 320, a plan view with one section removed, a cross-sectional view through the spring-loaded contact region, and a cross-sectional view through the center region, respectively. In these and other figures, the apparatus 320 is provided with four spring-loaded contacts 34 projecting out from the case 31. In FIG. 6, the four spring-loaded contacts 34 are a set of two disposed in an upper row designated as first spring-loaded contacts 34A, and a set of two disposed in a lower row designated as second spring-loaded contacts 34B.

The apparatus 320 is provided with an attachment surface 32 to mount electrical equipment on the upper surface of the case 31, and houses rechargeable batteries 36 and the circuit board 33 inside the case 31. The attachment surface 32 is an inclined surface and electrical equipment 321 attaches to it in an inclined fashion. Four sets of spring-loaded contacts 34 comprising the first spring-loaded contacts 34A and the second spring-loaded contacts 34B are fixed to the circuit board 33. In FIGS. 6 through 9, the first spring-loaded contacts 34A and the second spring-loaded contacts 34B are fixed to the circuit board 33 in close proximity to one another.

Figure 11:
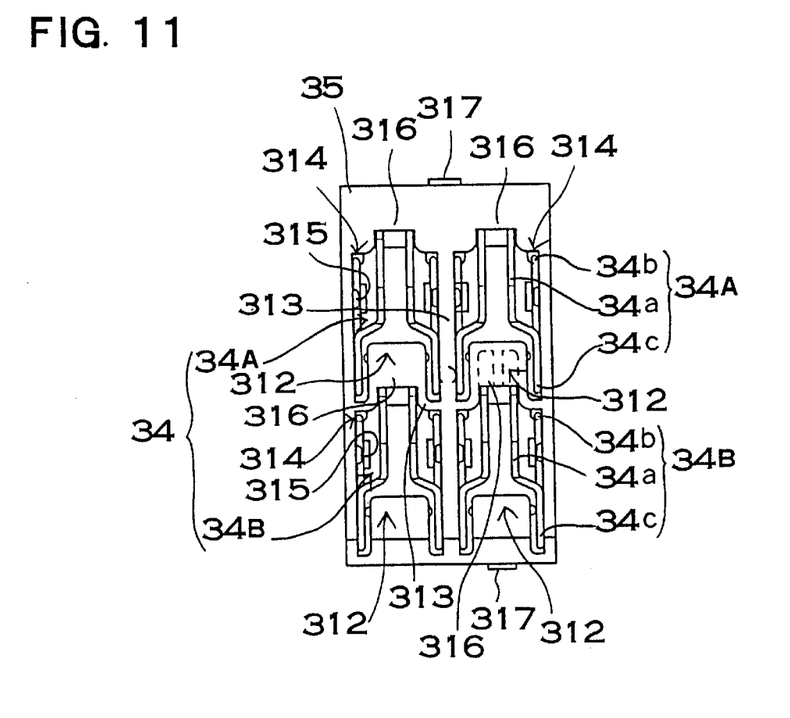
FIG. 11 is an enlarged plan view of the holder and spring-loaded contacts of the apparatus shown in FIG. 7.
Figure 12:
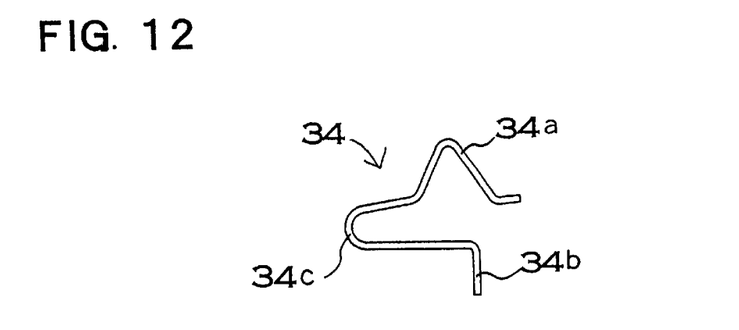
FIG. 12 is a side view of a spring-loaded contact shown in FIG. 10.
Figure 13:
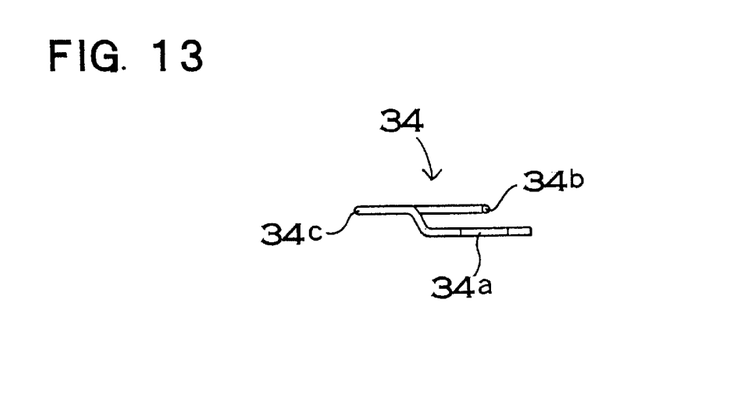
FIG. 13 is a plan view of the spring-loaded contact shown in FIG. 12.

The spring-loaded contacts 34 are fixed to the circuit board 33 via a holder 35. The holder 35 and spring-loaded contacts 34 are shown in the perspective view of FIG. 10 and the plan view of FIG. 11, and a spring-loaded contact 34 is shown in the side view of FIG. 12 and the plan view of FIG. 13. The spring-loaded contacts 34 shown in these and other figures are fabricated by processing which bends and shapes wire material which can deform resiliently. The first and second spring-loaded contacts 34A, 34B are provided with connection segments 34a which connect with electrical equipment terminals, attachment segments 34b which attach to a board or substrate, and flexible arm segments 34c which are disposed between the attachment segments 34b and the connection segments 34a and which deform resiliently to push the connection segments 34a into electrical equipment terminals with elasticity. The spring-loaded contacts 34 shown in the figures have attachment segments directly fixed to the circuit board 33. Consequently, the board or substrate to which the attachment segments 34b of this apparatus 320 are fixed is the circuit board 33. However, the attachment segments of the spring-loaded contacts may instead be fixed to the case or the holder rather than the circuit board.

Figure 14:
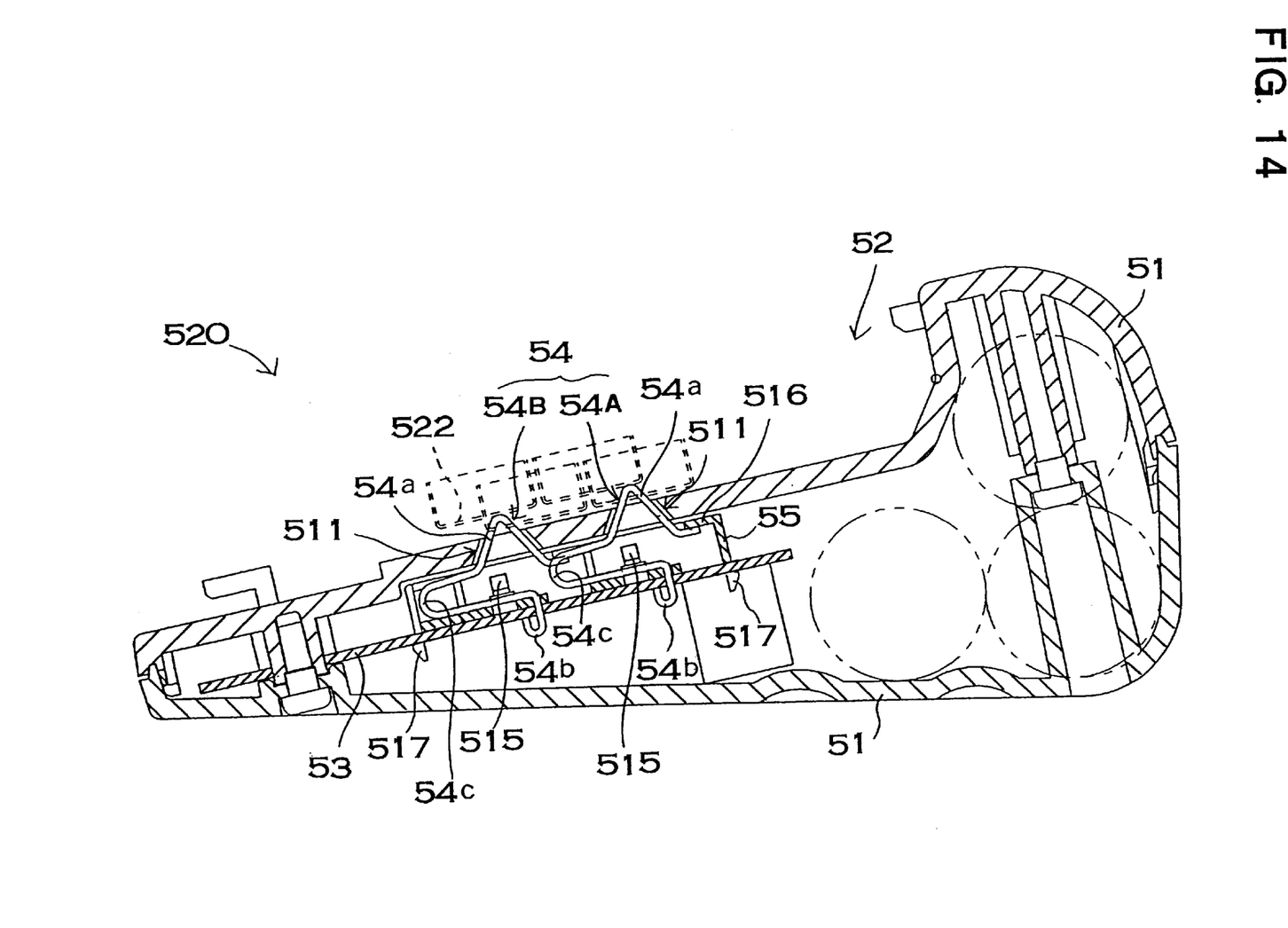
FIG. 14 is a cross-sectional view of an apparatus of another embodiment of the present invention.
Figure 15:
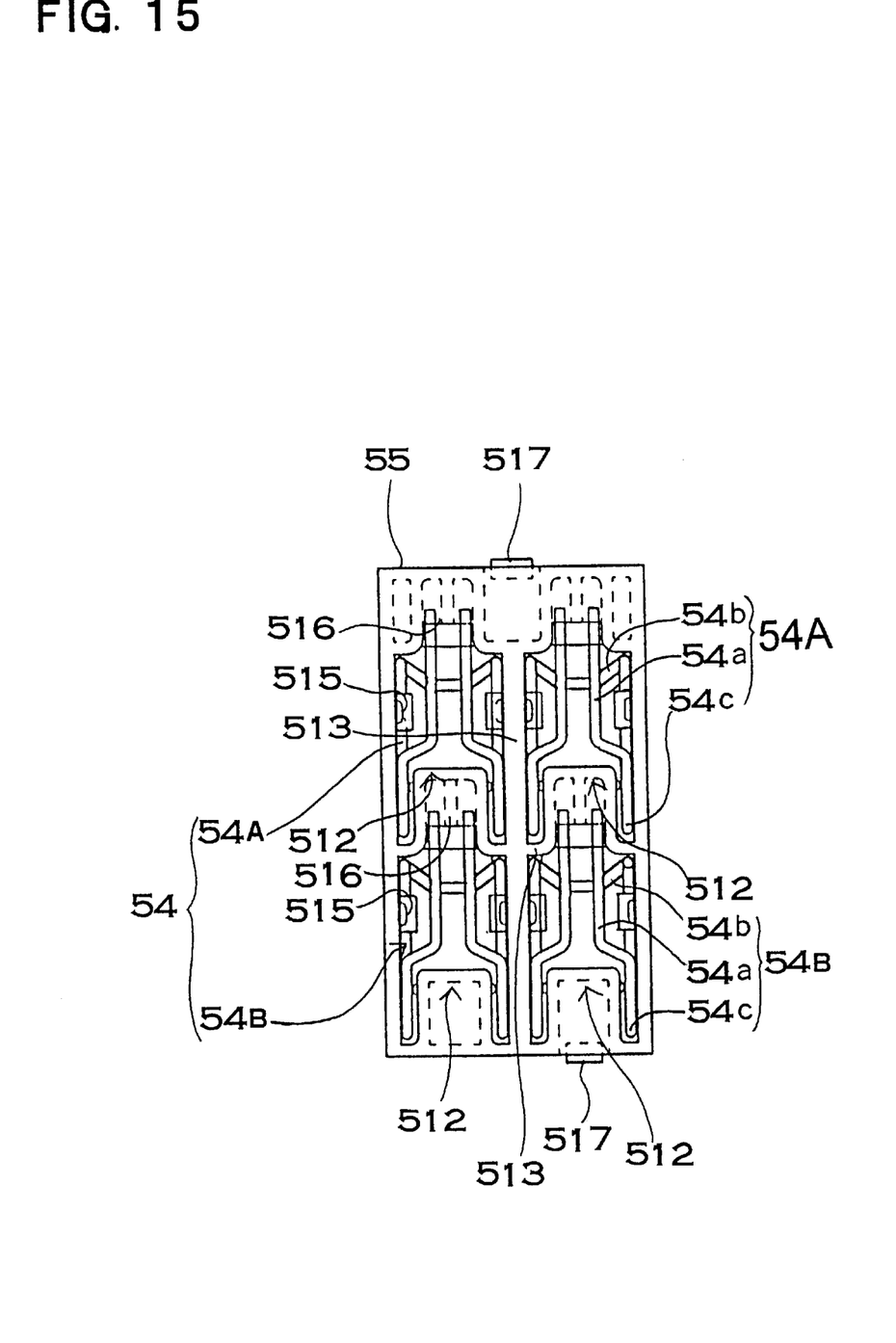
FIG. 15 is an enlarged plan view of the holder and spring-loaded contacts of the apparatus shown in FIG. 14.
Figure 16:
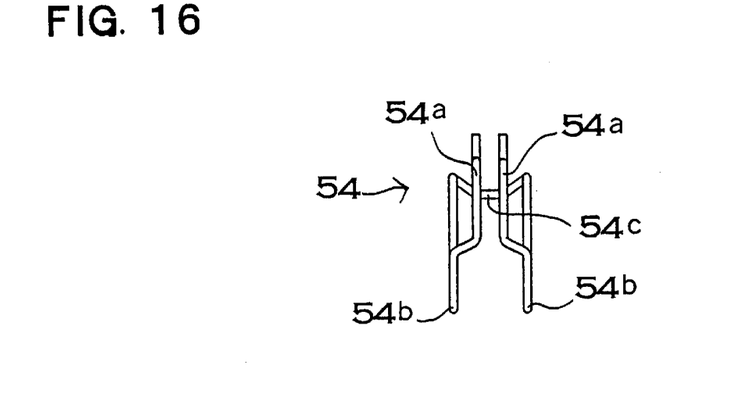
FIG. 16 is a plan view of a spring-loaded contact shown in FIG. 15.
Figure 17:
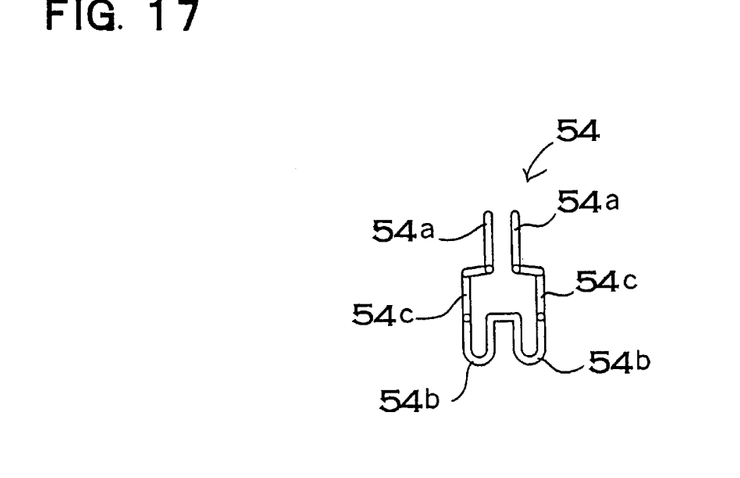
FIG. 17 is a front view of the spring-loaded contact shown in FIG. 16.
Figure 18:
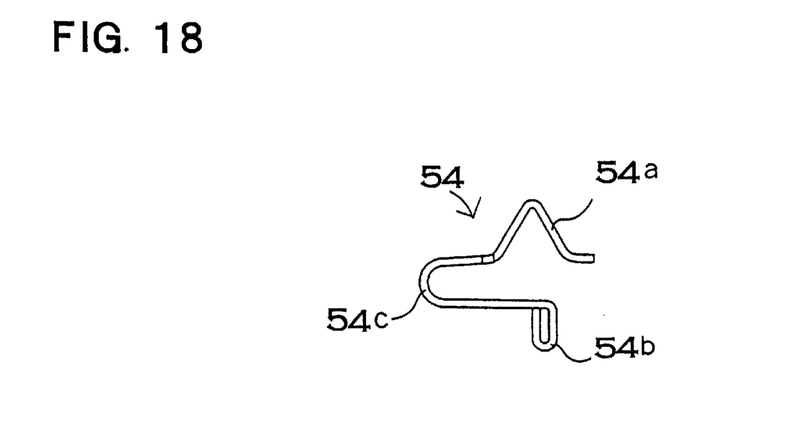
FIG. 18 is a side view of the spring-loaded contact shown in FIG. 16.

Each first spring-loaded contact 34A and each second spring-loaded contact 34B is provided with a pair of connection segments 34a disposed in close proximity to one another. The connection segments 34a of the spring-loaded contacts 34 shown in the figures have triangular shapes with vertices which project externally through electrode windows 311. One pair of connection segments 34a has two connection segments 34a disposed parallel and close to one another for contact with one electrical equipment terminal. Each first spring-loaded contact 34A and each second spring-loaded contact 34B shown in the figures has two pieces of flexible wire material arranged in the holder 35 providing a pair of connection segments 34a. However, as shown in FIGS. 14 and 15, each first and second spring-loaded contact may also have the form of a single piece of wire material processed by bending and having a pair of connection segments 54a. The spring-loaded contacts 54 shown in these and other figures have connected attachment segments 54b making single piece units as shown in the plan view of FIG. 16, the front view of FIG. 17, and the side view of FIG. 18. In FIG. 14, 51 is the case, 52 is the attachment surface, 53 is the circuit board, 55 is the holder, 511 are electrode windows, 520 is the apparatus, and 522 are terminals.

Spring-loaded contacts 34, 54 have flexible arm segments 34c, 54c bent in U-shapes. Further, flexible arm segments 34c, 54c of first spring-loaded contacts 34A, 54A have widened regions 312, 512 where those flexible arm segments 34c, 54c extend towards connection segments 34a, 54a of second spring-loaded contacts 34B, 54B. Parts of second spring-loaded contacts 34B, 54B are disposed within these widened regions 312, 512. Since the spring-loaded contacts 34, 54 of the figures have first and second spring-loaded contacts 34A, 54A, 34B, 54B of the same shape, second spring-loaded contacts 34B, 54B also have widened regions 312, 512 provided along flexible arm segments 34c, 54c. The spring-loaded contacts 34, 54 of the figures have second spring-loaded contact 34B, 54B connection segment 34a, 54a tips inserted into first spring-loaded contact 34A, 54A widened regions 312, 512. Consequently, widened regions 312, 512 of first spring-loaded contacts 34A, 54A are made wider than a pair of connection segments 34a, 54a of a second spring-loaded contact 34B, 54B.

Attachment segments 34b, 54b are provided at the ends of the U-shaped flexible arm segments 34c, 54c. Attachment segments 34b are formed by bending flexible arm segment ends downward in L-shapes, and these downward bent segments pass through the holder 35 and their end regions are attached to the circuit board 33 by soldering.

Figure 10:
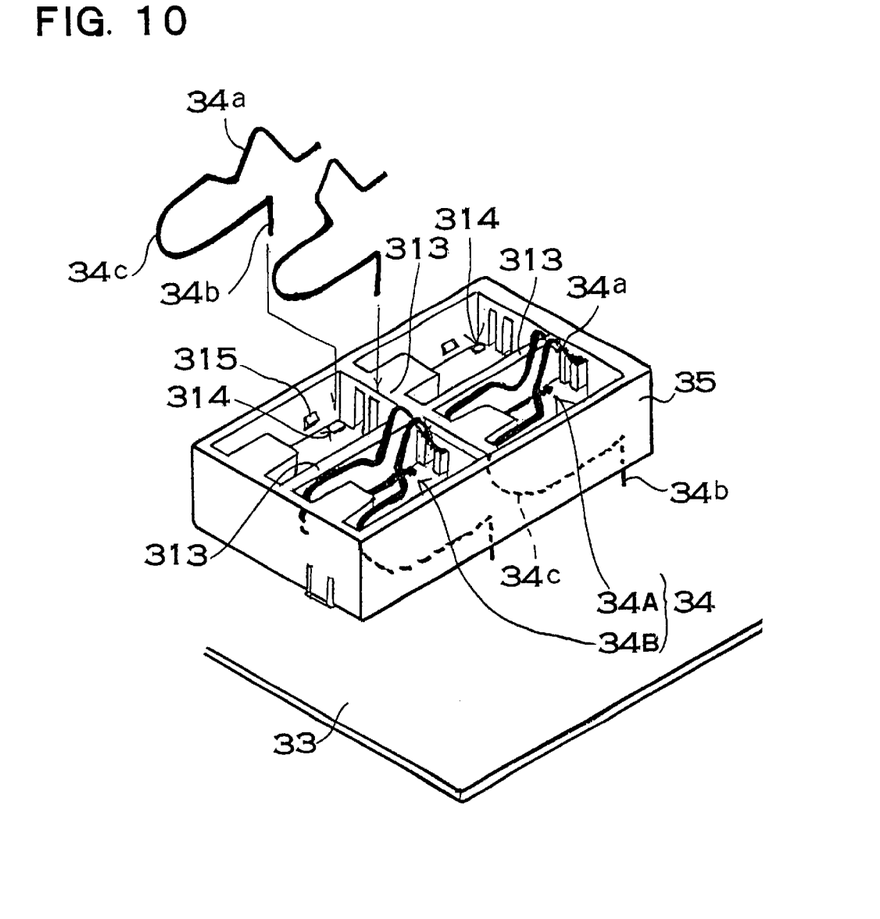
FIG. 10 is an exploded perspective view of the holder and spring-loaded contacts of the apparatus shown in FIG. 7.

The holder 35 of FIG. 10 is a formed piece of insulating material such as plastic, and its shape is that of a box with an open top. This holder 35 has its interior divided into four sections by walls 313, spring-loaded contacts 34 are disposed in each section, thus four sets of spring-loaded contacts 34 are mounted in the separate sections divided by walls 313. In this figure, since one set of spring-loaded contacts 34 is made up of two pieces of wire, eight pieces of flexible wire material are mounted in the holder 35. In FIG. 10, the two sets of spring-loaded contacts 34 at the upper right are designated first spring-loaded contacts 34A, and the two sets of spring-loaded contacts 34 at the lower left are designated second spring-loaded contacts 34B. The holder 35 is provided with through-holes 314 in its bottom surface for insertion of spring-loaded contact 34 attachment segments 34b, and with locking projections 315 formed as a single piece with the holder 35 for holding flexible arm segments 34c in place. Further, the holder 35 is provided with stoppers 316 to retain the tips of the triangular shaped connection segments 34a while allowing them to move up and down. A set of spring-loaded contacts 34 loaded into the holder 35 has its attachment segments 34b inserted into through-holes 314, its flexible arm segments 34c interlocked with locking projections 315, and the tips of its connection segments 34a against the under-surface of the stoppers 316 thereby retaining the spring-loaded contacts 34 in fixed positions. In FIGS. 14 and 15, 513 are walls, 515 are locking projections, and 516 are stoppers.

In addition, the holder 35, 55 is provided with hooks 317, 517 projecting from its bottom surface and formed as a single piece with the holder 35, 55 for attachment to the circuit board 33, 53. The hooks 317, 517 insert into through-holes provided in the circuit board 33, 53 to attach the holder 35, 55 at a fixed position on the circuit board 33, 53. The holder is formed with a height such that the upper surface of the holder 35, 55 reaches the inner surface of the case 31, 51.

Figure 19:
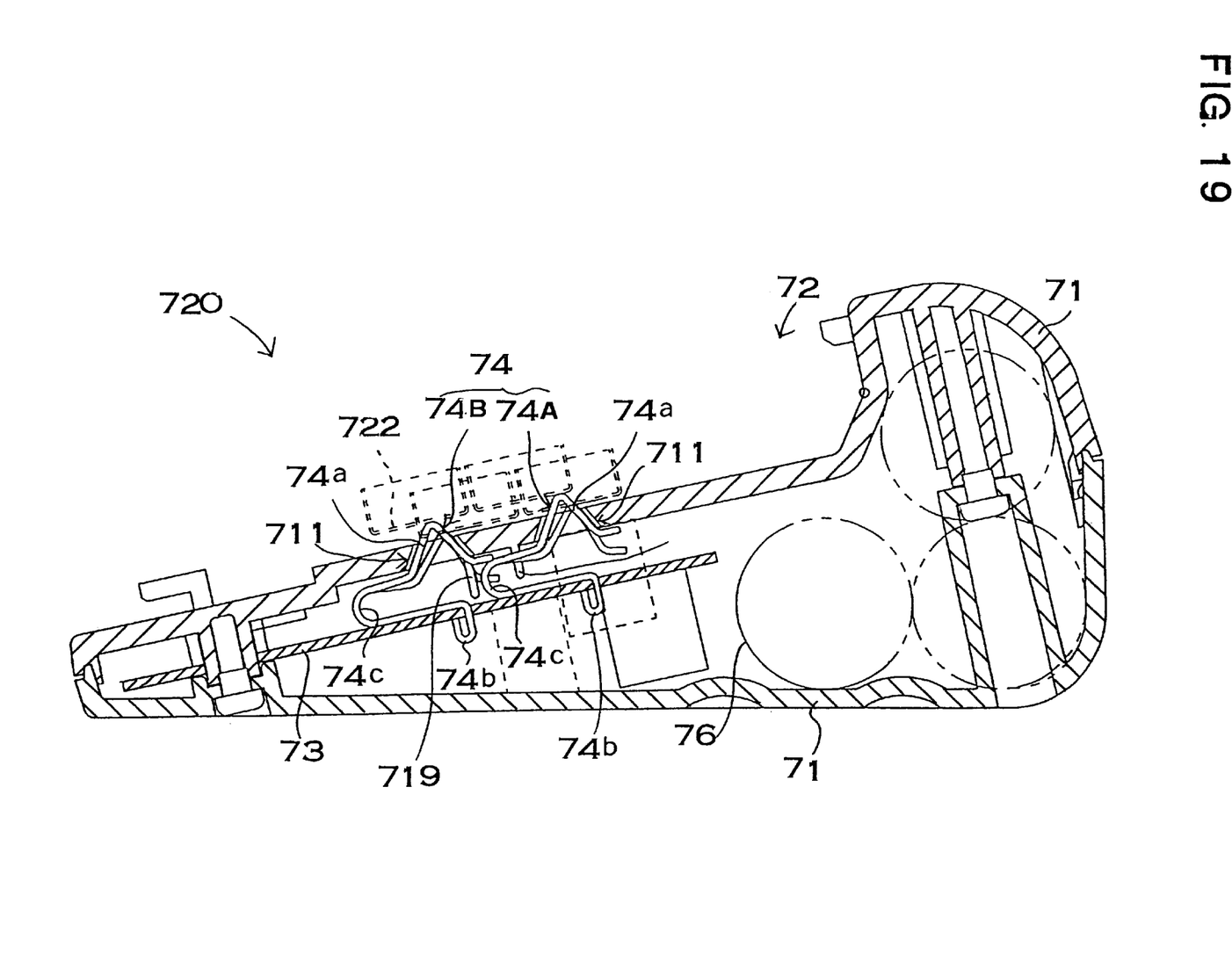
FIG. 19 is a cross-sectional view of an apparatus of another embodiment of the present invention.
Figure 20:
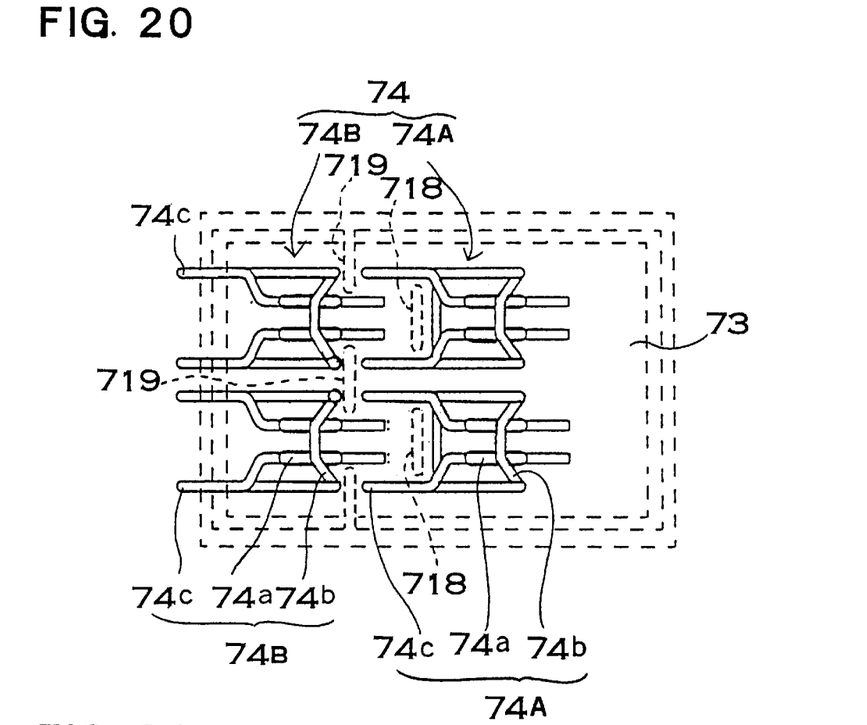
FIG. 20 is an enlarged plan view of the spring-loaded contacts of the apparatus shown in FIG. 19.
Figure 21:
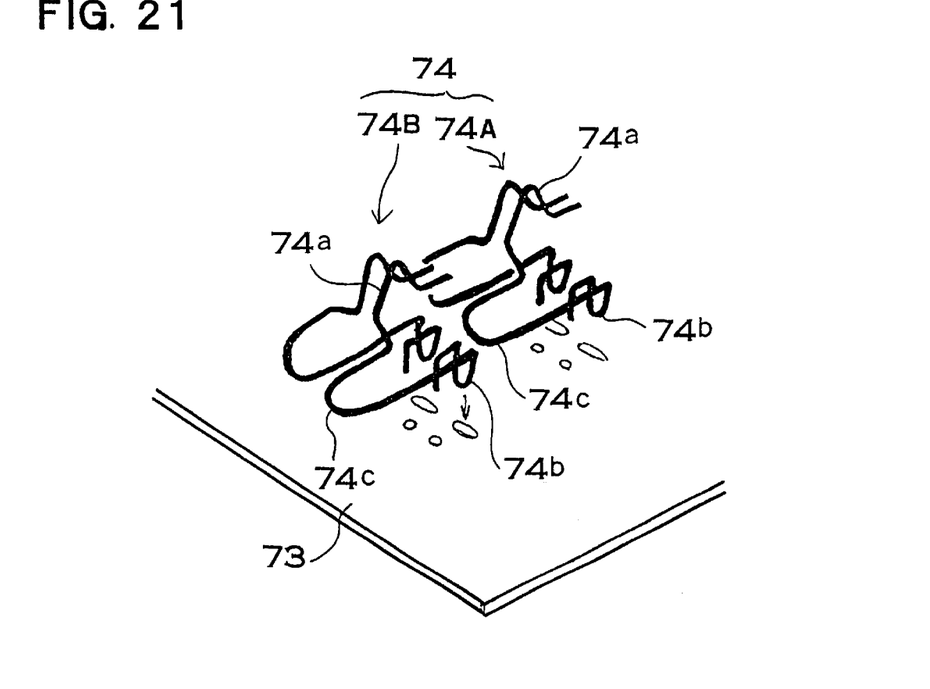
FIG. 21 is an exploded perspective view of the spring-loaded contacts of the apparatus shown in FIG. 19.

A configuration where spring-loaded contacts 34, 54 attach to the circuit board 33, 53 via a holder 35, 55 has the characteristic that spring-loaded contacts 34, 54 are reliably retained in fixed positions. However, as shown in FIGS. 19 through 21, spring-loaded contacts 74 may also be attached to the circuit board 73 without using a holder. In these figures, the spring-loaded contacts 74 are attached to fixed positions on the circuit board 73 by soldering the attachment segments 74b to the circuit board 73. The tips of the connection segments 74a of the spring-loaded contacts 74 ride against the inside surface of the case 71 to arrest the projecting positions of the connection segments 74a. Further, the case 71 in these figures is provided with ribs 718 on its inside surface formed as a single piece with the case 71. The ribs 718 are disposed inside the widened regions 712 of the first spring-loaded contacts 74A to separate the wire of the spring-loaded contacts 74. Still further, the case 71 in these figures is provided with ribs 719 formed as a single piece with the case 71 to retain the circuit board 73, and the gap between the circuit board 73 and the case 71 is maintained at a fixed dimension via these ribs 719. Finally, in FIGS. 19 through 21, 72 is the attachment surface, 74B are the second spring-loaded contacts, 74c are the flexible arm segments, 76 are rechargeable batteries, 711 are electrode windows, 720 is the apparatus, and 722 are the terminals.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims or equivalence of such meets and bounds thereof are therefore intended to be embraced by the claims.

What is claimed is:

1. An apparatus for use with electrical equipment, said apparatus comprising a plurality of spring-loaded contacts for making an electrical connection by resiliently presssing against terminals of the electrical equipment when attached to said apparatus in a detachable fashion, wherein said spring-loaded contacts comprises at least one first spring-loaded contact and at least one second spring-loaded contact disposed in close proximity to one another, each of said first and second spring-loaded contacts comprising:

a pair of connection segments for electrically connecting with the electrical equipment terminals, said connection segments being disposed in close proximity to one another;

a pair of attachment segments for attaching to a board or substrate; and a pair of flexible arm segments interconnecting said attachment segments and said connection segments, each of said flexible arm segments being resiliently deformable so as to resiliently press the connection segments against the electrical equipment terminals, wherein said pair of flexible arm segments of said first spring-loaded contact are contiguous with said pair of connection segments of said first spring-loaded contact, and said pair of flexible arm segments of said first spring-loaded contact define a widened end region relative to an opposite end region that is defined by said connection segments of said first spring-loaded contact, wherein said flexible arm segments of said first spring-loaded contact extend in an extension direction towards said connection segments of said second spring-loaded contact, and a part of said second spring-loaded contact is disposed inside the widened end region of said first spring-loaded contact, and the widened end region extends in a direction that is perpendicular to the extension direction.

2. The apparatus as claimed in claim 1, wherein said first spring-loaded contact and said second spring-loaded contact have the same shape.

3. The apparatus as claimed in claim 1, wherein said flexible arm segments of said first spring-loaded contact and said second spring-loaded contact extend in the same direction.

4. The apparatus as claimed in claim 1, wherein said first spring-loaded contact is constructed from a single piece of flexible wire material.

5. The apparatus as claimed in claim 1, wherein each of said first and second spring-loaded contacts are constructed from two separate pieces of flexible wire material.

6. The apparatus as claimed in claim 1, wherein the electrical equipment is a DVD player and said apparatus is a power supply housing for rechargeable batteries for supplying power to the DVD player.

7. The apparatus as claimed in claim 1, further comprising a circuit board, wherein said first and second spring-loaded contacts are attached to said circuit board.

8. The apparatus as claimed in claim 1, wherein each of said flexible arm segments of said first and second spring-loaded contacts has the form of a U-shaped bend.

9. The apparatus as claimed in claim 8, wherein said attachment segments are provided at the ends of said U-shaped flexible arm segments.

10. The apparatus as claimed in claim 7, further comprising a holder, wherein said first and second spring-loaded contacts are attached to said circuit board via said holder.

11. The apparatus as claimed in claim 10, wherein said attachment segments pass through said holder and are attached to said circuit board by soldering.

12. The apparatus as claimed in claim 10, wherein said holder is provided with a plurality of hooks projecting from a bottom surface thereof, and said hooks are formed integrally with said holder, and said hooks are inserted into through-holes provided in said circuit board to attach said holder at a fixed position on said circuit board.

13. The apparatus as claimed in claim 1, further comprising a holder, wherein said first and second spring-loaded contacts are attached in said holder so as to be disposed in fixed positions.

14. The apparatus as claimed in claim 13, wherein said holder includes stoppers which retain tips of the connection segments while allowing them to move up and down.

15. The apparatus as claimed in claim 13, wherein said holder is formed of insulating material and has the shape of a box with an open upper side.

16. The apparatus as claimed in claim 15, wherein said holder comprises a plurality of walls that divide an interior of said holder into a plurality of sections, and said first and second spring-loaded contacts are disposed in said sections, respectively.

17. The apparatus as claimed in claim 15, further comprising locking projections for holding said flexible arm segments in place, wherein said holder has a bottom surface provided with through-holes, wherein said attachment sections of said first and second spring-loaded contact attachment segments are inserted in said through holes, respectively, and wherein said locking projections are formed as a single piece with said holder.

* * * * *